(12) United States Patent
Horiuchi et al.

(10) Patent No.: US 6,242,799 B1
(45) Date of Patent: Jun. 5, 2001

(54) ANISOTROPIC STRESS BUFFER AND SEMICONDUCTOR DEVICE USING THE SAME

(75) Inventors: Michio Horiuchi; Shigetsugu Muramatsu, both of Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/192,490

(22) Filed: Nov. 17, 1998

(30) Foreign Application Priority Data

Nov. 18, 1997 (JP) .................................................. 9-316847

(51) Int. Cl.$^7$ .................................................. H01L 23/04
(52) U.S. Cl. ............................. 257/700; 257/698; 257/701
(58) Field of Search .................................. 257/783, 782, 257/698, 701, 729, 710

(56) References Cited

U.S. PATENT DOCUMENTS

| | | | | |
|---|---|---|---|---|
| 5,264,726 | * | 11/1993 | Yamaguchi et al. | 257/687 |
| 5,468,681 | * | 11/1995 | Pasch | 437/183 |
| 5,474,458 | * | 12/1995 | Vafi et al. | 439/91 |
| 5,561,321 | * | 10/1996 | Hirano et al. | 257/700 |
| 5,660,917 | * | 8/1997 | Fujimori et al. | 428/195 |
| 5,734,201 | * | 3/1998 | Djennas et al. | 257/783 |
| 5,847,456 | * | 12/1998 | Shoji | 257/737 |
| 5,854,534 | * | 12/1998 | Beilin et al. | 257/691 |
| 5,874,175 | * | 2/1999 | Li | 428/457 |
| 5,920,123 | * | 7/1999 | Moden | 257/678 |
| 5,943,212 | * | 8/1999 | Horiuchi et al. | 361/704 |
| 5,986,338 | * | 11/1999 | Nakajima | 257/700 |
| 6,011,312 | * | 1/2000 | Nakazawa et al. | 257/778 |
| 6,034,437 | * | 3/2000 | Shibata | 257/783 |
| 6,084,297 | * | 7/2000 | Brooks et al. | 257/698 |

FOREIGN PATENT DOCUMENTS

| | | | | |
|---|---|---|---|---|
| 08132342A | * | 5/1996 | (JP) | 257/737 |
| 09298255A | * | 11/1997 | (JP) | 257/698 |

* cited by examiner

*Primary Examiner*—Mahshid Saadat
*Assistant Examiner*—Lourdes Cruz
(74) *Attorney, Agent, or Firm*—Staas Halsey LLP

(57) ABSTRACT

An anisotropic stress buffer includes a plate or sheet-like body having relatively low elastic modulus. A plurality of elements, each having relatively high elastic modulus, are contained in the plate or sheet-like body, in such a manner that the buffer has a characteristic as a high elastic modulus member having a Young's modulus higher than a predetermined value with respect to a compression stress in the thickness direction and also has a characteristic as a low elastic modulus member having a Young's modulus lower than the predetermined value with respect to a tension stress in the planar direction. A semiconductor device includes such a anisotropic stress buffer to which a semiconductor chip is adhered. Electrode terminals of the chip are electrically connected to a wiring pattern formed on the anisotropic stress buffer.

12 Claims, 4 Drawing Sheets

ANISOTROPIC STRESS BUFFER AND SEMICONDUCTOR DEVICE USING THE SAME

BACKGROUND OF THE INVENTION

1. Field of the Invention

The present Invention relates to an anisotropic stress buffer and a semiconductor device using the same.

2. Description of the Related Art

It is usual to interpose a soft body having a low elastic modulus as a stress buffer between two members, which are made of a material having a different thermal expansion coefficient from that of the other, when the two members are bonded together or when one of the two members is heated after being bonded, for the purpose of releasing a stress generated due to the difference in thermal expansion coefficient between the two members.

For example, when a semiconductor device is mounted to a substrate, the above-mentioned soft body having a low elastic modulus (stress buffer) is interposed between the two to facilitate the electric connection between circuits on the semiconductor device and the substrate. As a typical example, there may be a case wherein the stress generated due to the thermal expansion is absorbed by the stress buffer provided on a chip scale semiconductor device, which formed in a size generally equal to that of a semiconductor chip, is connected (surface-mounted) to the substrate. To enable the high density mounting, such a chip size semiconductor device is closer in size to a bare chip as compared to the usual semiconductor device. However, the thermal expansion stress due to the heat generation from the semiconductor chip itself is liable to be directly applied thereto. It means that it is indispensable to provide a stress buffer for releasing the stress in the horizontal direction.

FIG. 6 is a sectional view illustrating the above-mentioned conventional chip size semiconductor device. An insulating member 20 is mounted on a surface 10a of a semiconductor chip 10, on which an electrode terminal 12 of the semiconductor chip 10 is formed, without covering the electrode terminal 12. The insulating member 20 composed of an elastomer 22 forming a stress buffer, as a main layer, is laminated to the semiconductor chip 10 via an adhesive 24. A circuit pattern 30 has a land 32 to be connected to an external connection terminal at one end and a lead 34 which is a conductor layer at the other end. This circuit pattern 30 is supported by an insulating film 36 and forms together therewith a tape substrate 38. An adhesive 35 adheres the circuit pattern 30 to the insulating film 36. The tape substrate 38 is adhered onto the insulating member 20 at the land 32 and connected to the electrode terminal 12 by a bonding at the lead 34. A resin shield 90 shields exposed portions of the lead 34 and the electrode terminal 12 after the lead 34 has been bonded. The external connection terminal is, for example, solder balls 40 connected to the land 32.

The stress buffer is useful for improving the reliability in electric connection not only when the above-mentioned chip size semiconductor device is mounted onto the substrate but also when a usual semiconductor device, in which a semiconductor chip is mounted to a semiconductor package, is mounted to a substrate.

As described above, to solve problems of stress caused by the difference in thermal expansion coefficient when two members are bonded together, a stress buffer made of a soft material having a small elastic modulus (a low elastic modulus member) may be used for releasing the stress. However, there is a still further problem in that the elastic modulus of such a stress buffer is too small to result in a proper balance between the softness and rigidity in all the directions.

Also, there may be a case wherein a low elastic modulus (softness) is required in one direction, while a high elastic modulus (rigidity) is required in the other direction. For example, in the field of the above semiconductor device, the stress buffer having a low elastic modulus in a planar direction in parallel to a mounting surface of the substrate and a predetermined rigidity (Young's modulus higher than a predetermined value) in a direction vertical to the mounting surface. If the stress buffer has the predetermined rigidity in the thickness direction thereof, it is possible to electrically connect the semiconductor chip with the semiconductor device via a wire bonding. Since the prior art stress buffer has a small elastic modulus in all the directions, it is difficult to carry out the wire bonding on the circuits formed on the surface of the stress buffer. This is because, while the wire bonding must be carried out under a predetermined load while applying heat and ultrasonic wave, the stress buffer operates as a cushion to cancel the load.

In this regard, the electric connection according to the wire bonding has a high reliability backed up by actual results. Also, the wire bonding is capable of preventing the quality of the product from deteriorating and the production cost from rising in comparison with other methods. Further, since the connection structure can be simplified, it is possible to meet a demand for the high density (micro) mounting or the shortening of a production process.

SUMMARY OF THE INVENTION

An object of the present invention is to provide an anisotropic stress buffer capable of releasing a stress caused by the difference in thermal expansion coefficient or others when two members are bonded together, and having a proper rigidity in a predetermined direction.

Another object of the present invention is to provide a semiconductor device using such an anisotropic stress buffer.

According to the present invention, there is provided an anisotropic stress buffer comprising: a plate or sheet-like body having relatively low elastic modulus, the body having a thickness direction thereof and a planar direction perpendicular to the thickness direction; and a plurality of particles, each having relatively high elastic modulus, contained in the plate or sheet-like body, in such a manner that the buffer has a characteristic as a high elastic modulus member having a Young's modulus higher than a predetermined value with respect to a compression stress in the thickness direction and also has a characteristic as a low elastic modulus member having a Young's modulus lower than the predetermined value with respect to a tension stress in the planar direction.

The plate or sheet-like body has a first surface and a second surface opposite to the first surface and at least one of the first and second surfaces is adhesive so that the buffer maintains its characteristics after the buffer is adhered to another member.

Each of the particles is a pillar-like high elastic modulus particles arranged in the plate or sheet-like body penetrating through the thickness direction of the body and substantially uniformly distributed in the planar direction of the body.

Otherwise, the plurality of particles are high elastic modulus particles distributed in the plate or sheet-like body. In this case, the high elastic modulus particles are ball-like particles. Otherwise, the high elastic modulus particles are flat particles arranged in the planar direction of the plate or sheet-like body.

Each of the particles has, as a single particle, a Young's modulus of not less than 100 KPa and not more than 10 MPa at a temperature between 20° C. and 100° C.

In another aspect of the present invention, there is provided a semiconductor device comprising: an anisotropic stress buffer comprising: a plate or sheet-like body having a first surface and a second surface opposite to the first surface and having relatively low elastic modulus, the body having a thickness direction thereof and a planar direction perpendicular to the thickness direction; and a plurality of particles, each having relatively high elastic modulus, contained in the plate or sheet-like body in such a manner that the buffer has a characteristic as a high elastic modulus member having a Young's modulus higher than a predetermined value with respect to a compression stress in the thickness direction and also has a characteristic as a low elastic modulus member having a Young's modulus lower than the predetermined value with respect to a tension stress in the planar direction; a wiring pattern formed on the first surface of the plate or sheet-like body; a semiconductor chip adhered to the second surface of the plate or sheet-like body, the semiconductor chip having electrode terminals; and means for electrically connecting the electrode terminals of the semiconductor chip to the wiring pattern on the buffer.

According to a further aspect of the present invention, there is provided a semiconductor device comprising: a package having a surface; a semiconductor chip mounted on the surface of the package; an anisotropic stress buffer mounted on the surface of the package; said anisotropic stress buffer comprising: a plate or sheet-like body having a first surface and a second surface opposite to the first surface and having relatively low elastic modulus, the body having a thickness direction thereof and a planar direction perpendicular to the thickness direction; and a plurality of particles, each having relatively high elastic modulus, contained in the plate or sheet-like body, in such a manner that the buffer has a characteristic as a high elastic modulus member having a Young's modulus higher than a predetermined value with respect to a compression stress in the thickness direction and also has a characteristic as a low elastic modulus member having a Young's modulus lower than the predetermined value with respect to a tension stress in the planar direction; a wiring pattern formed on the first surface of the plate or sheet-like body; the semiconductor chip having a first surface adhered to said package and a second surface on which electrode terminals are formed; and means for electrically connecting the electrode terminals of the semiconductor chip to the wiring pattern on the buffer.

In there semiconductor device, the thickness of the anisotropic stress buffer is not less than 20 μm and not more than 200 μm.

DETAILED DESCRIPTION OF THE PREFERRED EMBODIMENTS

The preferred embodiments of the present invention will how be described in detail below with reference to the attached drawings.

Figure 1A:
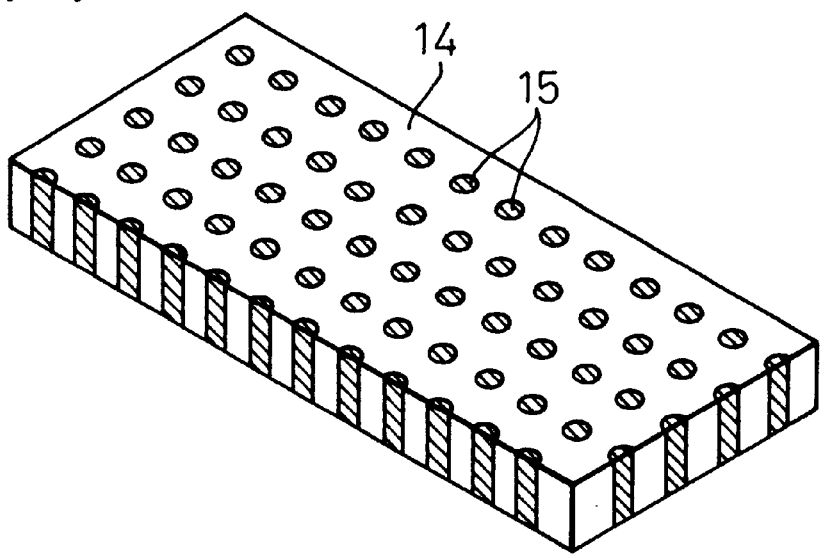
FIGS. 1(a) to 1(c) are illustrations of one embodiment of the present invention wherein pillar-like high elastic modulus particles are dispersed.
Figure 1B:
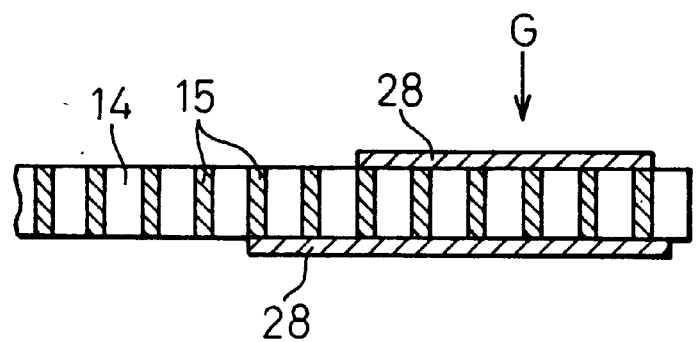
Figure 1C:
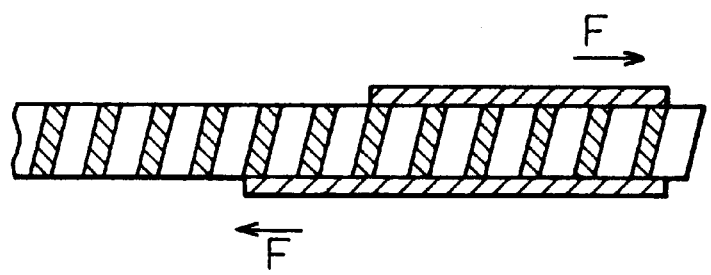

FIGS. 1(a) to 1(c) schematically illustrates one embodiment of an anisotropic stress buffer according to the present invention, wherein FIG. 1(a) is a perspective view, FIG. 1(b) is a sectional view when a compressive stress is applied in the thickness direction, and FIG. 1(c) is a sectional view when a shearing stress is applied in a planar direction. In this regard, in FIGS. 1(b) and 1(c), there are shown states wherein planar circuits (circuits 28) are formed on the opposite sides of a sheet-like anisotropic stress buffer, respectively.

This anisotropic stress buffer is constructed to have a high Young's modulus of a predetermined value or more, which is inherent to a high elastic modulus member, against a compressive stress in the thickness direction and a low Young's modulus smaller than the former, which is inherent to a low elastic modulus member, against a stretching stress or a shearing stress in the planar direction transverse to the thickness direction.

As apparent from the drawings, according to the anisotropic stress buffer of this embodiment, in a low elastic modulus sheet 14, a plurality of pillar-like high elastic modulus particles 15 (having a Young's modulus larger than that of the low elastic modulus sheet 14) are favorably provided to penetrate through the low elastic modulus sheet 14 in the thickness direction thereof, while being distributed in the planar direction of the low elastic modulus sheet 14. That is, it can be said that the low elastic modulus sheet 14 is formed in a continuous manner, while the pillar-like high elastic modulus particles 15 are distributed in a discrete manner in the planar direction. Further, in the embodiment shown in FIG. 1, the pillar-like high elastic modulus particles 15 having a length corresponding to a thickness of the low elastic modulus sheet 14 are arranged at a pitch in parallel to each other in the thickness direction of the low elastic modulus sheet 14. Thereby, if at least one of the pillar-like high elastic modulus elements 15 exists in a contact area, this area behaves as a high elastic modulus member against a compressive stress applied in the thickness direction (shown by an arrow G in FIG. 1(b)), due to the characteristic of the pillar-like high elastic modulus particle 15. Contrarily, against a stretching stress applied in the planar direction vertical to the thickness direction, it behaves as a low elastic modulus member due to the characteristic of a matrix having a low elastic modulus (the low elastic modulus sheet 14). Also, it behaves as a low elastic modulus member against a shearing stress in the planar direction (shown by an arrow F in FIG. 1(c)), due to the characteristic of the matrix and the slanting of the pillar-like particle 15.

In these drawings, a number of pillar-like high modulus elements 15 having the same shape are regularly distributed. However, according to the present invention, they may be arranged in various manners in accordance with the uses of the stress buffer. That is, it is unnecessary to form the high elastic modulus elements in the same shape or regularly arrange them, provided a predetermined area exhibits, as a whole, a predetermined elastic modulus characteristic. In other words, if the same characteristic is obtained in every unit area, each of the high elastic modulus elements may have a different shape from others, or be randomly distributed.

If the anisotropic stress buffer has an adhesiveness and the above-mentioned characteristics are revealed (i.e., exhibited) after being adhered to another member, it is capable of being easily applied to various uses with no adhesive.

The anisotropic stress buffer having the above-mentioned structure may be prepared by any one of the following methods:

(1) A high elastic modulus sheet is irradiated with energy beam in an ultraviolet wavelength range through a mask to cut intermolecular bonds in a predetermined continuous region and to a certain extent so that the elastic modulus of the predetermined region is lowered.

(2) A prepolymer sheet is irradiated with an energy beam in a predetermined wavelength range through a mask to develop a degree of polymerization in predetermined discrete regions further than (i.e., exceeding) that in other regions. Or, the prepolymer sheet is cured while a predetermined continuous region thereof is prevented, to some extent, from being polymerized.

(3) A high elastic modulus sheet is formed on a support member and irradiated with energy beam through a mask to remove material comprising a predetermined continuous region thereof, to form a cavity. Thereafter, a low elastic modulus material is filled in the cavity. In this case, polyamide may be used as material for the high elastic modulus sheet, and silicone rubber may be used as the low elastic modulus material.

Other embodiments will now be described in detail based on FIG. 2(a) to 2(c) and 3(a) and 3(b).

An anisotropic stress buffer may be obtained by dispersing high elastic modulus particles 16 or 18 in a low elastic modulus sheet 14 (the particle 16 or 18 has a higher Young's modulus than that of the sheet 14), having a characteristic of a high elastic modulus member, against a compressive stress applied in the thickness direction, and that of a low elastic modulus member, against a stretching stress and a shearing stress applied in the planar direction, transverse to the thickness direction. As such a high elastic modulus particle, a ball-like particle 16 (FIGS. 2(a) to 2(c)) or a flat particle 18 (FIGS. 3(a) and 3(b)), made of hexagonal system boron nitride, silica, alumina, spinel, or the others, may be used for forming the anisotropic stress buffer having the above-mentioned desired property. On the other hand, as a material for the low elastic modulus sheet in which the high elastic modulus particles are dispersed, resins are suitably used, having a Young's modulus of 10 MPa or less at a temperature in a range from room temperature to 100° C., including silicone resin, polyimide resin, polyolefin resin, cyano-ester resin or the others.

Figure 2A:
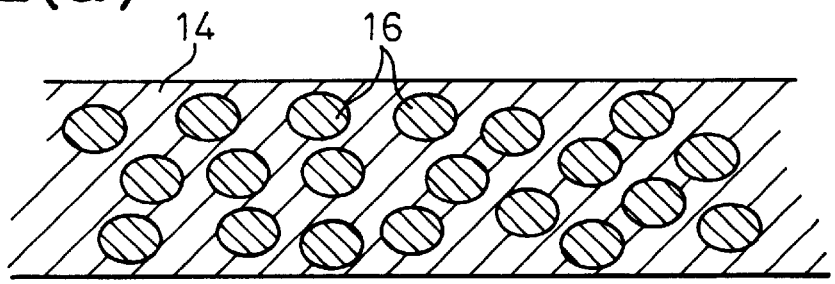
FIGS. 2(a) to 2(c) are sectional views of another embodiment of the present invention wherein ball-like particles are dispersed.
Figure 2B:
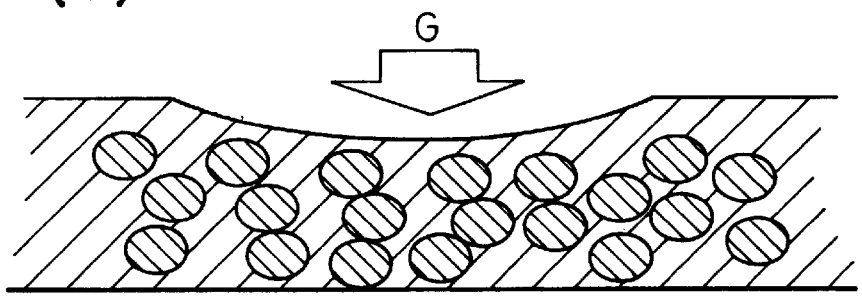
Figure 2C:
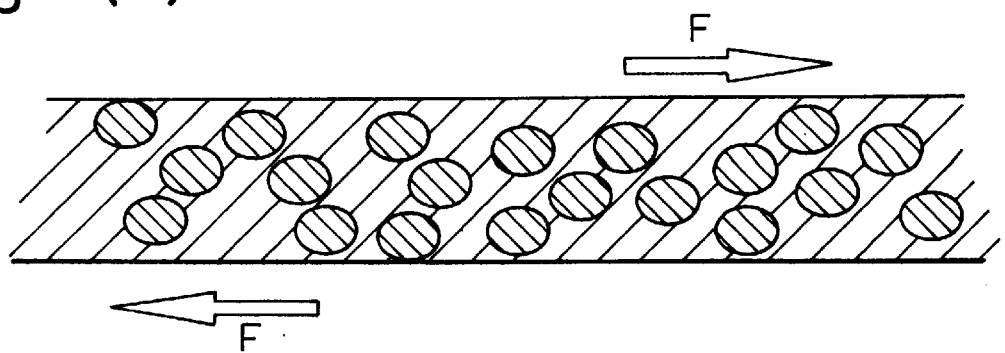

By mixing a powder of high elastic modulus material having a predetermined size (i.e., high elastic modulus particles, such as the ball-like particles 16 shown in FIG. 2) in the low elastic modulus sheet 14 at a predetermined ratio by volume, a stress buffer is obtained which exhibits a behavior like a high elastic modulus member against the compressive stress in the thickness direction (shown by an arrow G in FIG. 2(b)) although such a behavior is in a discontinuous manner (i.e., is dependent on direction and type of stress). That is, if the compressive stress is instantaneously applied, these high elastic modulus particles are brought into contact with each other or in a state nearly equal thereto. On the other hand, in response to a slowly applied stretching stress or shearing stress in the planar direction shown by arrow F in FIG. 2(c), it deforms as a whole to behave as a low elastic modulus member. This behavior rather resembles a "dilatancy phenomenon" because it is influenced by the speed at which the stress is applied.

This structure is obtainable by dispersing a powder of high elastic modulus material having a particle size in a special range (i.e., high elastic modulus particles) in a fluidized prepolymer of low elastic modulus material and then curing the same.

Figure 3A:
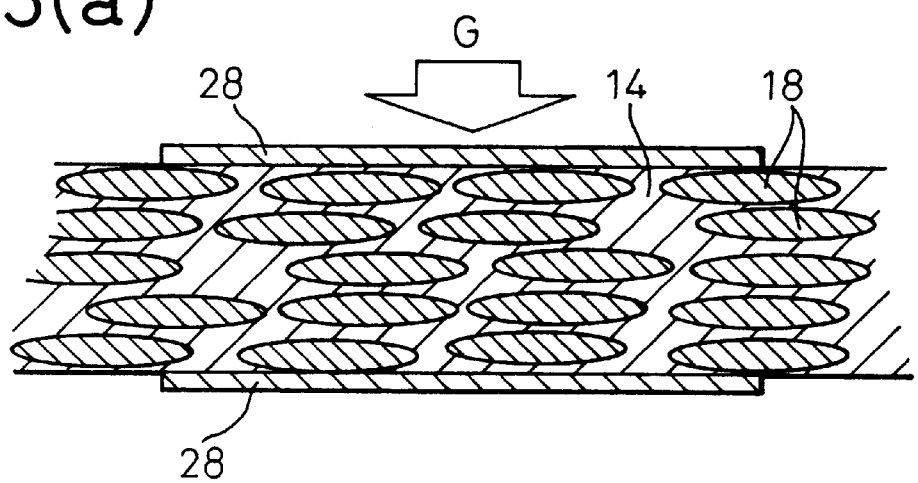
FIGS. 3(a) and 3(b) are sectional views of a further embodiment of the present invention wherein flat particles are dispersed and FIG. 3(c) shows a flat particle.
Figure 3B:
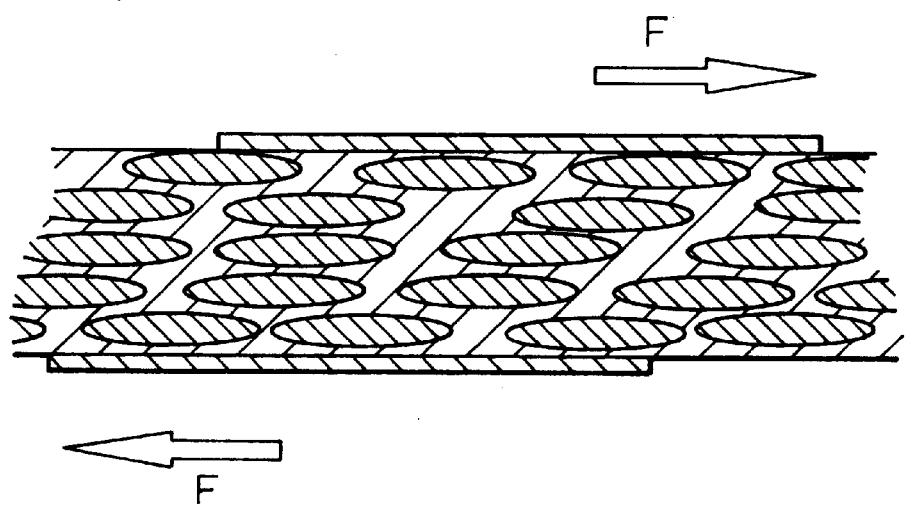
Figure 3C:
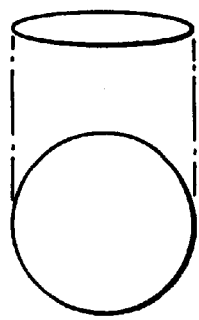

If the powder of high elastic modulus material dispersed in the fluidized prepolymer is of a flat particle type having a special configuration flat particle as shown at 18), the flat particles 18 tend to orient in parallel to each other because they are easily dispersed in the flowing direction of the fluidized prepolymer (see FIG. 3(a) and 3(b)). In such a manner, by filling the flat particles 18 relatively densely in the sheet while orienting the same in parallel to the sheet surface, the structure exhibits a characteristic of a high elastic modulus member against a compressive stress applied in the thickness direction (shown by an arrow G in FIG. 3(a)) in proportional to a volume ratio of the high elastic modulus particles arranged in series in the thickness direction. On the other hand, it rather exhibits a characteristic of a low elastic modulus member against a shearing stress applied in the planar direction (shown by an arrow F in FIG. 3(b)), accompanied with an overall deformation in the planar direction.

To facilitate the mobility of the flat particles 19 in the planar direction, the particles are preferably hexagonal system boron nitride or others having a high lubricity. On the other hand, the matrix is preferably an organic compound having a lower visco-elasticity. Also, silica, alumina or spinel may be suitably used as the flat particle 18.

EXAMPLE 1

A favorable anisotropic stress buffer was prepared by coating a sheet of approximately 1 mm thick polyimide type thermoplastic adhesive having a Young's modulus of approximately 3 GPa at 30° C. with a dispersion containing molybdenum particles of approximately 30 $\mu$m size at a volume ratio of approximately 5%, irradiating an KrF excimer laser beam all over the sheet after drying, and rinsing the same, wherein pillar-like high elastic modulus particles are distributed in the low elastic modulus sheet.

According to this example, the dispersion containing molybdenum particles operates as a mask so that portions of the sheet to which the excimer laser beam is not irradiated due to the reflection thereof on the molybdenum particles become the pillar-like high elastic modulus particles.

In place of the molybdenum particles, particles of other heavy metals may be used as those for reflecting excimer laser beam.

EXAMPLE 2

A marketed flat type alumina powder having a typical longest particle diameter in a range from 60 to 100 $\mu$m was mixed into a precursor of silicon type elastomer having a Young's modulus of approximately 1 MPa as a simple structure at a volume ratio of 52%, which mixture was coated to be 100 $\mu$m thick on a polyimide film having a thickness of 25 $\mu$m and clad with a copper foil of 35 $\mu$m thick, and was cured at 150° C. for 30 min to form a rubbery layer. Thus, a favorable anisotropic stress buffer was obtained.

EXAMPLE 3

All over a surface of a silicon type rubber sheet of approximately 150 μm thick having a Young's modulus of approximately 3 MPa was irradiated with excimer laser beam via a metallic mask to form through-holes having a diameter of approximately 100 μm at an area density of approximately 50%.

Then, polyimide varnish was filled in the through-holes and cured at 200° C. for one hour to obtain a favorable anisotropic stress buffer.

Next, aspects wherein the above-mentioned anisotropic stress buffers according to the present invention are applied to a semiconductor device will be described with reference to FIGS. 4 and 5.

Figure 4:
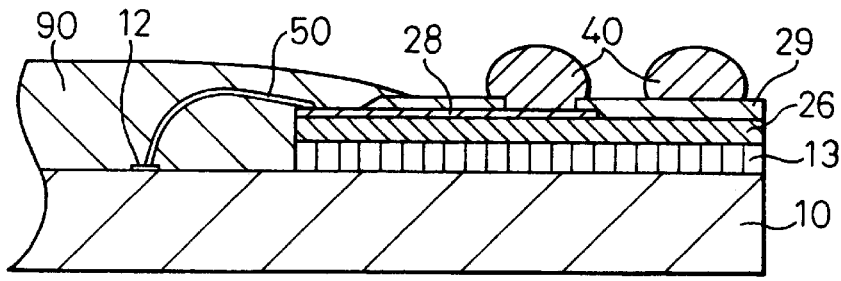
FIG. 4 is a sectional view of a main part of one embodiment of a chip-sized semiconductor device according to the present invention.

FIG. 4 shows a cross-section of a main part of a chip-sized semiconductor device. In this semiconductor device, one surface of the above-mentioned anisotropic stress buffer 13 is bonded to a surface of a semiconductor chip 10 on which an electrode terminal 12 of the semiconductor chip 10 is provided, and a circuit 28 formed on the other surface of the anisotropic stress buffer 13 is electrically connected to the electrode terminal 12 of the semiconductor chip 10 by a wire 50 due to the wire bonding.

The anisotropic stress buffer 13 has a characteristic of a high elastic modulus member exhibiting a Young's modulus higher than a predetermined value as well as a rigidity higher than a predetermined value. Accordingly, it is possible to suitably connect the wire 50 even by the wire bonding requiring a load larger than a predetermined value.

In this regard, according to this embodiment, the circuit 28 is formed on the surface of the anisotropic stress buffer 13 via an insulating substrate 26 made, for example, of polyimide or others. Reference numeral 29 denotes a solder resist; 40 a solder ball; and 90 a shield material.

In such a manner, if this anisotropic stress buffer 13 is used, it is possible to preferably carry out the wire bonding and eliminate a problem caused by a stress due to a thermal expansion during the mounting of the chip-sized semiconductor device onto a substrate.

Figure 5:
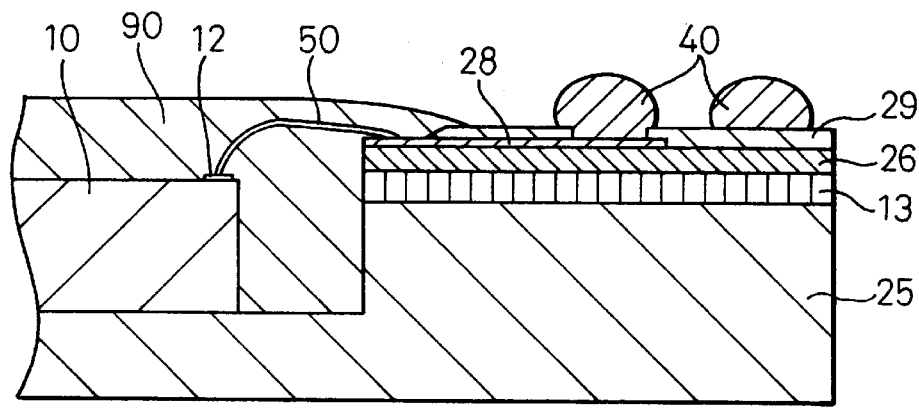
FIG. 5 is a sectional view of a main part of one embodiment of a semiconductor device according to the present invention.
Figure 6:
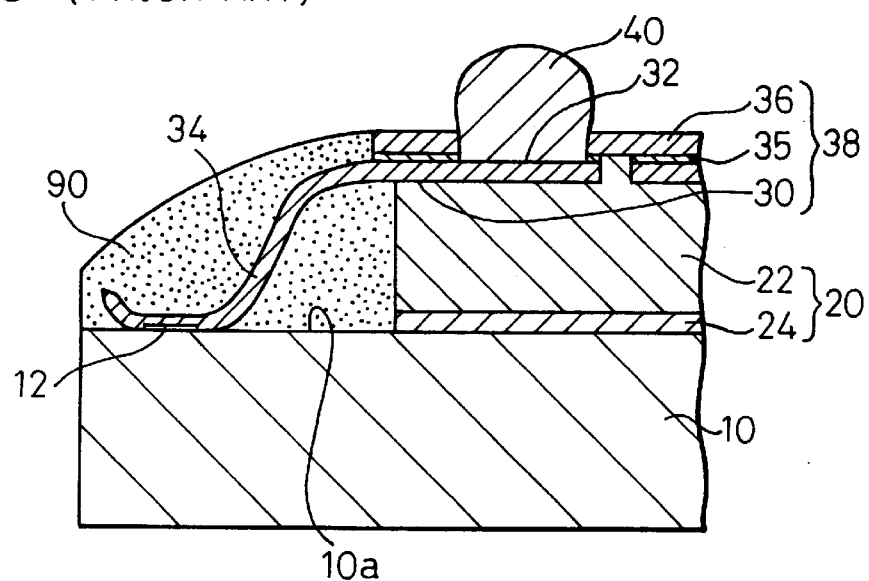
FIG. 6 is a sectional view of a main part of a semiconductor device known in the prior art.

FIG. 5 shows a cross-section of a main part of a usual semiconductor device wherein a semiconductor chip is shielded in a semiconductor package. According to this semiconductor device, as described above, one surface of the anisotropic stress buffer 13 is bonded to a surface of a package substrate (package base 25) onto which a semiconductor chip 10 is adhered by one surface thereof opposite to another surface on which an electrode terminal 12 of the semiconductor chip is provided. A circuit 28 formed on the other surface of the anisotropic stress buffer 13 is connected to the electrode terminal 12 of the semiconductor chip 10 via a wire 50 by a wire bonding.

The anisotropic stress buffer 13 has a characteristic of a high elastic modulus member exhibiting a Young's modulus larger than a predetermined value and a rigidity higher than a predetermined value in the thickness direction. Therefore, it is possible to favorably connect the wire 50 even by a wire bonding which requires a predetermined large load.

In this regard, according to this embodiment, the circuit 28 is formed on the surface of the anisotropic stress buffer 13 via an insulating substrate 26 made, for example, of polyimide or others. Also, reference numeral 29 denotes a solder resist; 40 a solder ball; and 90 a shield material.

In such a manner, if this anisotropic stress buffer 13 is used, it is possible to preferably carry out the wire bonding and eliminate a problem caused by a stress due to a thermal expansion during the mounting of the semiconductor device onto a substrate.

Then, a concrete example will be described below with reference to FIG. 5.

EXAMPLE 4

A circuit film (the insulating substrate 26 and the circuit 28) finished with an electroplated gold was adhered to a substrate of aluminum nitride ceramic having a cavity via the anisotropic stress buffer 13 (adhesive layer) of a flat alumina particle dispersion type similar to that used in Example 2, and cured. Thereafter, a silicon piece (dummy chip) forming an aluminum surface was mounted into the cavity. It was confirmed that a second bonding is favorably carried out by a wire bonding using a gold wire of 35 μm diameter.

As described above, if the anisotropic stress buffer 13 according to the present invention is used for the production of a semiconductor device, it is possible to release a stress cause by the difference in thermal expansion coefficient between materials relating to the surface mounting, and to complete the electric connection while using a wire bonding having a high reliability. Accordingly, it is possible to improve the reliability of the resultant semiconductor device. The wire bonding is capable of preventing characteristics of the product from deteriorating and the production cost from rising, compared with other methods. Also, since the connection structure is simple, this meets the requirement of high density mounting and the shortening of production process.

In this regard, if a thickness of the anisotropic stress buffer 13 is in a range from 20 to 200 μm, it can be used as an adhesive layer allowable in the design of general semiconductor packages.

While the anisotropic stress buffer is bonded to the circuit film, semiconductor chip or semiconductor package by its own adhesiveness in the embodiments shown in FIGS. 4 and 5, the present invention should not be limited thereto. For example, an adhesive layer may be separately provided on the anisotropic stress buffer. In such a case, although the high elastic modulus characteristic against a compressive stress in the thickness direction becomes somewhat lower, the adhesiveness is further improved to ensure the bonding.

A stress is applied at a high speed in the wire bonding while at a low speed in the mounting of the semiconductor device. Therefore, material composing the anisotropic stress buffer 13 preferably has a difference in the response to the stress application speed in addition to the above-mentioned directional difference. That is, the material preferably exhibits a "dilatant behavior" under the application of stress.

According to the present invention, the anisotropic stress buffer of the present invention behaves as a high elastic modulus member against a compressive stress in the thickness direction, having a Young's modulus higher than a predetermined value, but behaves as a low elastic modulus member against a stretching stress and a shearing stress in the planar direction transverse to the thickness direction.

Thus, if the anisotropic stress buffer is used as a buffer for releasing a stress when two members are bonded together, it is possible to favorably release a stress caused by the difference in thermal expansion coefficient and to provide a proper rigidity in a predetermined direction.

As described above, the present invention have been explained in detail with reference to the preferred embodiments. It should be noted that the present invention is not limited thereto but an include various changes and modifications without departing from the spirit and scope of the invention.

What is claimed is:

1. An anisotropic stress buffer, comprising:
   a plate or sheet-like body having a first Young's modulus value, said body having a thickness direction thereof and a planar direction perpendicular to said thickness direction; and
   a plurality of particles, each having a second Young's modulus value greater than the first Young's modulus value, dispersed in said plate or sheet-like body in such a manner that said buffer has a characteristic of a third Young's modulus value with respect to a compression stress in said thickness direction, greater than the first Young's modulus value and a characteristic of a fourth Young's modulus value, lower than said third Young's modulus value, with respect to a tension stress in said planar direction.

2. An anisotropic stress buffer as set forth in claim 1, wherein said plate or sheet-like body has a first surface and a second surface opposite to said first surface, at least one of said first and second surfaces being adhesive and said buffer maintaining said characteristics after said buffer is adhered by said adhesive surface thereof to another member.

3. An anisotropic stress buffer as set forth in claim 1, wherein each of said particles is a pillar-like elastic modulus particle, arranged in said plate or sheet-like body and penetrating through said body in said thickness direction and substantially uniformly distributed in the planar direction of said body.

4. An anisotropic stress buffer as set forth in claim 1, wherein said plurality of particles comprise high elastic modulus particles distributed in said plate or sheet-like body.

5. An anisotropic stress buffer as set forth in claim 4, wherein said high elastic modulus particles are ball-like particles.

6. An anisotropic stress buffer as set forth in claim 4, wherein said high elastic modulus particles are flat particles arranged in the planar direction of said plate or sheet-like body.

7. An anisotropic stress buffer as set forth in claim 1, wherein each of said particles has, as a single particle, a Young's modulus value of not less than 100 KPa and not more than 10 MPa at the condition of 20° C. to 100° C.

8. A semiconductor device comprising:
   an anisotropic stress buffer comprising:
      a plate or sheet-like body having a first surface and a second surface, opposite to said first surface, and having a first Young's modulus value, said body having a thickness direction and a planar direction perpendicular to said thickness direction; and
      a plurality of particles, each having a second Young's modulus value greater than the first Young's modulus value, dispersed in said plate or sheet-like body in such a manner that said buffer has a characteristic of a third Young's modulus value with respect to a compression stress in said thickness direction, greater than the first Young's modulus value, and a characteristic of a fourth Young's modulus value, lower than said third Young's modulus value, with respect to a tension stress in said planar direction;
   a wiring pattern formed on said first surface of the plate or sheet-like body;
   a semiconductor chip adhered to said second surface of the plate or sheet-like body, said semiconductor chip having electrode terminals; and
   electrical connections connecting said electrode terminals of the semiconductor chip to said wiring pattern on the buffer.

9. A semiconductor device as set forth in claim 8, wherein said semiconductor chip has a surface which is adhered to said second surface of the plate or sheet-like body and also on which said electrode terminals are formed on said first surface of the semiconductor chip.

10. A semiconductor device as set forth in claim 8 wherein said anisotropic stress buffer has a thickness of not less than 20 μm and not more than 200 μm.

11. A semiconductor device comprising:
   a package having a surface;
   a semiconductor chip mounted on said surface of the package;
   an anisotropic stress buffer mounted on said surface of the package;
   said anisotropic stress buffer comprising:
      a plate or sheet-like body having a first surface and a second surface, opposite to said first surface, and having a first Young's modulus value, said body having a thickness direction and a planar direction perpendicular to said thickness direction, and
      a plurality of particles, each having a second elastic modulus in accordance with a second Young's modulus value greater than the first Young's modulus value, dispersed in said plate or sheet-like body in such a manner that said buffer has a characteristic of a third Young's modulus value with respect to a compression stress in said thickness direction, greater than the first Young's modulus value, and a characteristic of a fourth Young's modulus value, lower than said third Young's modulus value, with respect to a tension stress in said planar direction;
   a wiring pattern formed on said first surface of the plate or sheet-like body;
   said semiconductor chip having a first surface adhered to said package and a second surface on which electrode terminals are formed; and
   electrical connections connecting said electrode terminals of the semiconductor chip to said wiring pattern on the buffer.

12. A semiconductor device as set forth in claim 11 wherein said anisotropic stress buffer has a thickness of not less than 20 μm and not more than 200 μm.

* * * * *

UNITED STATES PATENT AND TRADEMARK OFFICE
CERTIFICATE OF CORRECTION

PATENT NO.     : 6,242,799 B1
DATED          : June 5, 2001
INVENTOR(S)    : Michio Horiuchi et al.

It is certified that error appears in the above-identified patent and that said Letters Patent is hereby corrected as shown below:

Column 3,
Line 51, change "there" to -- the --.

Column 4,
Lines 62 & 66, change "elements" to -- particles --.

Column 5,
Line 3, change "elements" to -- particles --;
Line 17, after "extent" insert -- , --.

Column 6,
Line 15, after "configuration" insert -- (e.g., a --;
Line 31, change "19" to -- 18 --.

Signed and Sealed this

Fifteenth Day of January, 2002

Attest:

Attesting Officer

JAMES E. ROGAN
*Director of the United States Patent and Trademark Office*